(12) United States Patent
Matsumura et al.

(10) Patent No.: US 8,463,564 B2
(45) Date of Patent: Jun. 11, 2013

(54) ABNORMALITY PREDICTION SYSTEM FOR SECONDARY BATTERIES

(75) Inventors: Hitoshi Matsumura, Tokyo (JP); Masazumi Ohishi, Tokyo (JP); Masataka Uchida, Tokyo (JP); Katsuaki Kobayashi, Tokyo (JP); Tetsuro Shigemizu, Tokyo (JP); Hidehiko Tajima, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 317 days.

(21) Appl. No.: 12/892,252

(22) Filed: Sep. 28, 2010

(65) Prior Publication Data

US 2011/0077881 A1 Mar. 31, 2011

(30) Foreign Application Priority Data

Sep. 29, 2009 (JP) ................ P2009-224225

(51) Int. Cl.
*G01R 31/36* (2006.01)

(52) U.S. Cl.
USPC ............ 702/63; 320/110; 320/132; 324/434; 429/185

(58) Field of Classification Search
USPC ............... 702/63–65, 82; 320/106, 116, 118, 320/128, 134, 136, 132; 324/426, 433, 434; 429/185

See application file for complete search history.

(56) References Cited

U.S. PATENT DOCUMENTS

| 4,053,824 | A  | * | 10/1977 | Dupuis et al. ............... 324/434 |
| 6,072,300 | A  |   | 6/2000  | Tsuji |
| 6,118,250 | A  | * | 9/2000  | Hutchison et al. ........... 320/110 |
| 6,703,162 | B2 | * | 3/2004  | Shiota et al. ................. 429/185 |
| 7,528,575 | B2 | * | 5/2009  | Murakami et al. ........... 320/132 |
| 2005/0242820 | A1 | | 11/2005 | Kume et al. |

FOREIGN PATENT DOCUMENTS

| GB | 1 494 458 A | 12/1977 |
| GB | 1 531 294 A | 11/1978 |
| JP | 6-75027 A | 3/1994 |
| JP | 2001-196102 A | 7/2001 |
| JP | 2001-313087 A | 11/2001 |

(Continued)

OTHER PUBLICATIONS

Japanese Office Action dated Aug. 9, 2011, issued in corresponding Japanese Patent Application No. 2009-224225.

(Continued)

*Primary Examiner* — John H Le
(74) *Attorney, Agent, or Firm* — Wetserman, Hattori, Daniels & Adrian, LLP

(57) ABSTRACT

An abnormality prediction system for secondary batteries according to the present invention includes: a parameter value detection portion that detects parameter values each corresponding to each of a plurality of secondary batteries to determine whether all the parameter values are normal or not; and a singular state determination portion that determines, if a difference between a reference value calculated by use of all the parameter values determined to be normal by the parameter value detection portion and at least one of the parameter values is not less than a threshold value, the secondary battery corresponding to the parameter value with the difference not less than the threshold value to be in a state different from those of the other secondary batteries out of the plurality of secondary batteries.

12 Claims, 7 Drawing Sheets

FOREIGN PATENT DOCUMENTS

| | | |
|---|---|---|
| JP | 2005-62028 A | 3/2005 |
| JP | 2005-151679 A | 6/2005 |
| JP | 2005-195604 A | 7/2005 |
| JP | 2006-136070 A | 5/2006 |
| JP | 2007-309839 A | 11/2007 |
| JP | 2008-186591 A | 8/2008 |
| JP | 2009-059504 A | 3/2009 |
| JP | 2009-152183 A | 7/2009 |
| WO | 2008/096771 A1 | 8/2008 |

OTHER PUBLICATIONS

European Search Report dated Dec. 28, 2010, issued in corresponding European Patent Application No. 10180313.8.

Japanese Notice of Allowance dated Nov. 6, 2012, issued in corresponding Japanese Patent Apllication No. 2009-224225, (6 pages). With English Translation.

* cited by examiner

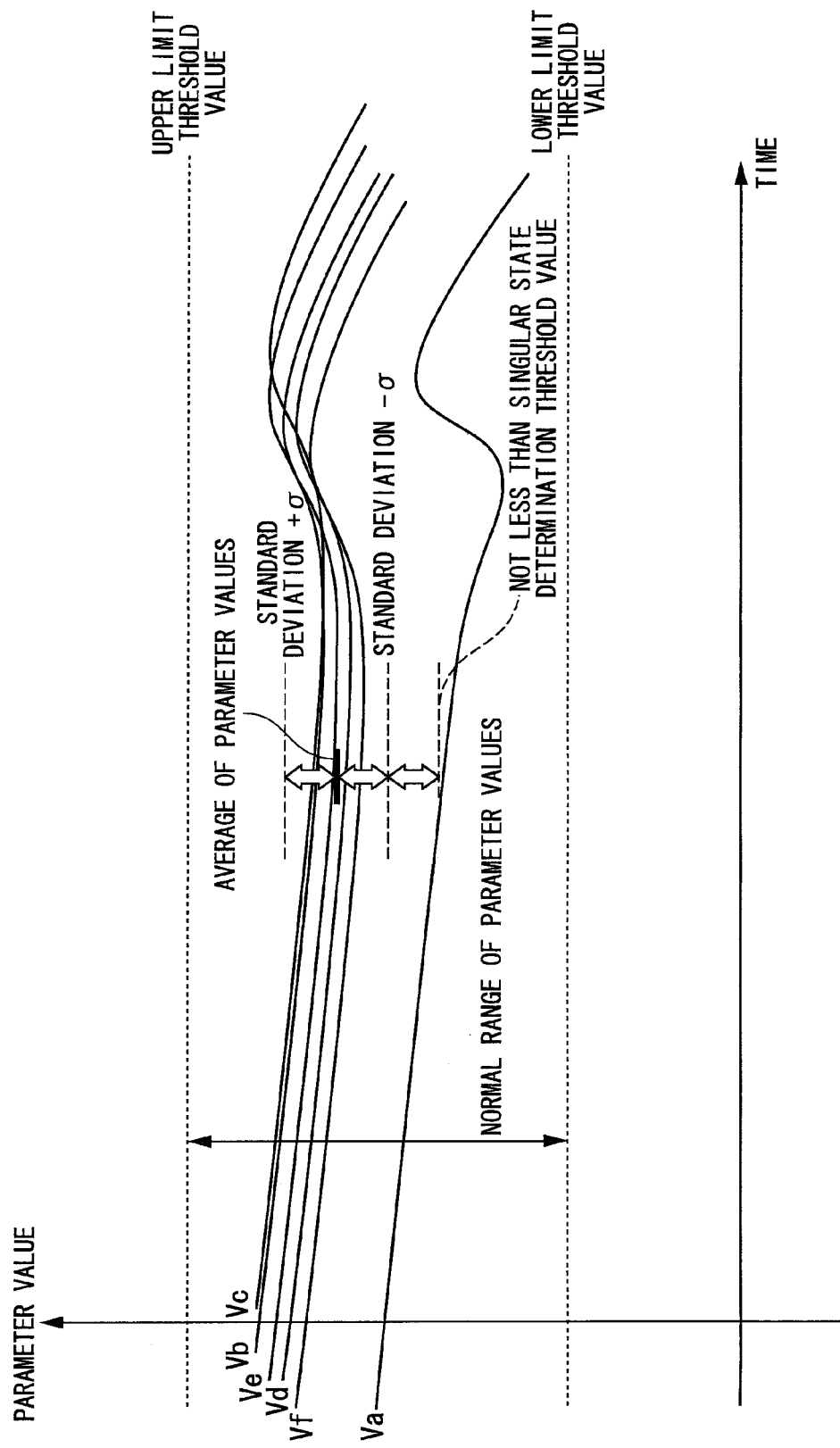

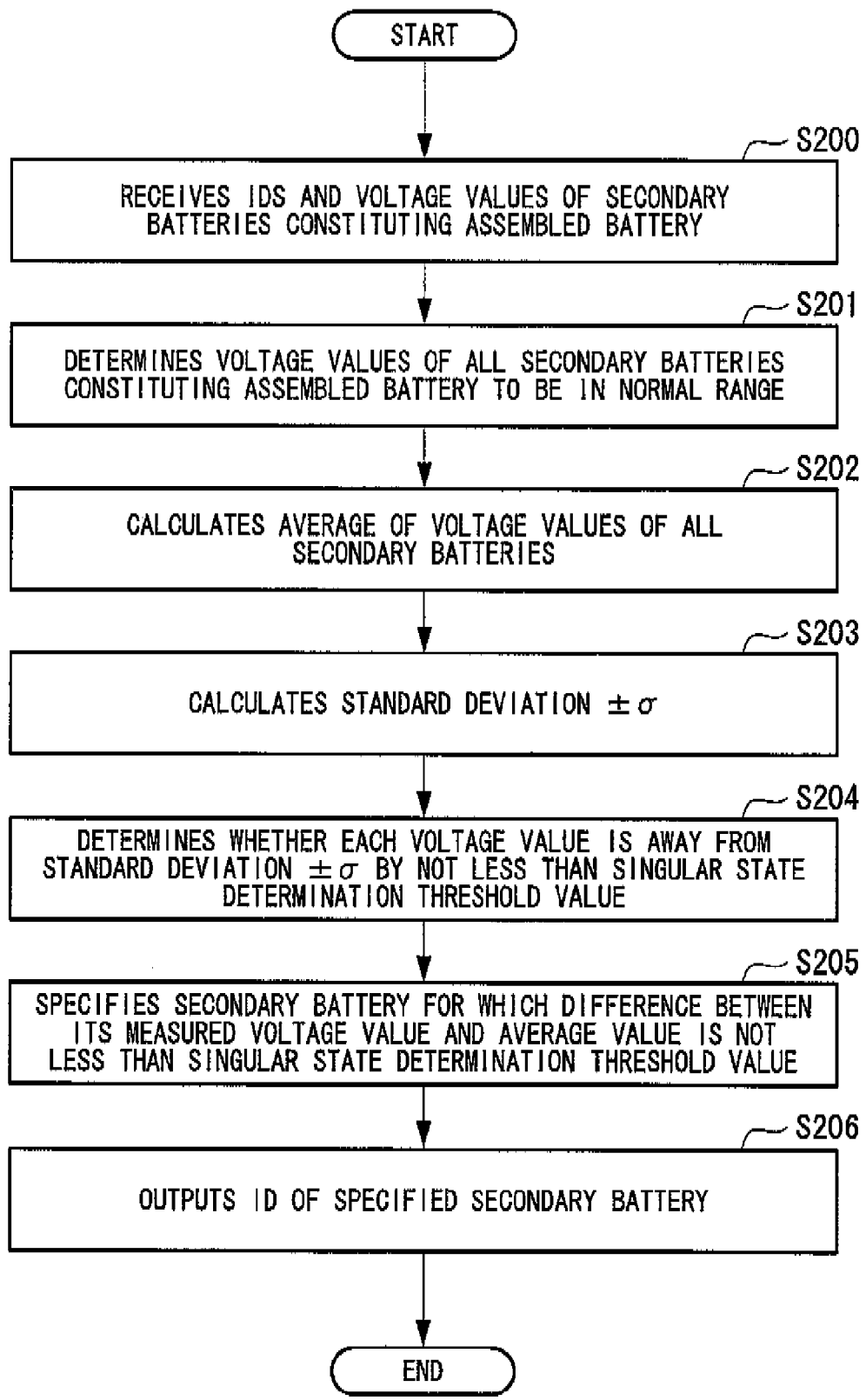

ABNORMALITY PREDICTION SYSTEM FOR SECONDARY BATTERIES

BACKGROUND OF THE INVENTION

1. Field of the Invention

The present invention relates to an abnormality prediction system for secondary batteries that predicts an abnormality in secondary batteries.

Priority is claimed on Japanese Patent Application No. 2009-224225, filed Sep. 29, 2009, the contents of which are incorporated herein by reference.

2. Description of the Related Art

As one of the techniques of determining an abnormality in secondary batteries, a technique is utilized in which a parameter value, such as a voltage or a temperature, indicative of a state of each secondary battery is measured and the battery whose parameter value is over a threshold value is determined to be abnormal.

In addition, to avoid a decrease in performance of an assembled battery due to variance in performance of a plurality of secondary batteries that constitute the assembled battery, there is proposed a technique of calculating their average voltage and adjusting variations in cell voltage (for example, Japanese Laid-Open Patent Publication, No. 2006-136070 (hereinafter, referred to as Patent Document 1)).

The techniques as described above improve performance and reliability of a secondary battery or the assembled battery in which a plurality of secondary batteries are used. Here, in such techniques, if an abnormality has occurred in one of the secondary batteries, the abnormality of the secondary battery is notified to a user (the equipment/system driven by the batteries, and its user). Conventionally, an abnormality of a secondary battery is notified to the user after the secondary battery is detected to be in an abnormal state. Therefore, if there is an unexpected bait or the like of the equipment/system due to an occurrence of the abnormality in a battery, there is a possibility of a large loss in merit for the user (for example, although required be operated at the present moment, the battery system becomes inoperable, or other cases). Therefore, there is a demand for a technique of predicting a secondary battery that can be in an abnormal state as early as possible before it becomes actually in an abnormal state, to thereby avoid the aforementioned event as much as possible.

Therefore, the present invention has an object to provide an abnormality prediction system for secondary batteries, capable of predicting a secondary battery that is likely to fall into the abnormal state before the secondary battery falls into the abnormal state.

SUMMARY OF THE INVENTION

In one aspect of the present invention, an abnormality prediction system for a plurality of secondary batteries comprises: a parameter value detection portion that detects parameter values respectively corresponding to each of the plurality of secondary batteries, and that determines whether all the parameter values are normal or not; and a singular state determination portion that determines, if a difference between a reference value calculated by use of all the parameter values determined to be normal by the parameter value detection portion and at least one of the parameter values is not less than a threshold value, the secondary battery corresponding to the parameter value with the difference not less than the threshold value to be in a state different from those of the other secondary batteries out of the plurality of secondary batteries.

The reference value may be an average value of all the parameter values determined to be normal.

The reference value may be a standard deviation of all the parameter values determined to be normal.

Each parameter value may be a temperature or voltage of a battery can, or an output electric current or output voltage, of each of the secondary batteries that constitute an assembled battery.

In each of the plurality of secondary batteries, a positive electrode and a battery can may be electrically connected to each other though a resistance interposed therebetween, and the parameter value may be a voltage between the battery can and a predetermined reference such as a negative electrode (hereinafter, referred to as a can potential).

It is preferable to detect very little leakage of an electrolyte and the like if the can potential is used for the parameter value.

A singular state may be determined with only a single parameter value. However, a determination by use of several kinds of parameter values enables the abnormality prediction system to determine an abnormality prediction more accurately.

The abnormality prediction system for secondary batteries, may further comprises: a display portion that displays, on receiving a determination by the singular state determination portion, a result of the determination; and an electrical load that is driven by the secondary batteries, the prediction system being any one mobile object of an industrial vehicle, an electric vehicle, a hybrid vehicle, a train, a ship, and an airplane. As the industrial vehicle, for example, a forklift may be exemplified. As the electric vehicle, one with an internal electric power converter such as an inverter, or one in which an electric motor is connected to wheels may be exemplified. As the airplane or a ship, one with an internal electric power converter such as an inverter, or one in which an electric motor is connected to a propeller or a screw may be exemplified.

Furthermore, the abnormality prediction system for secondary batteries according to the present invention may be a non-mobile electrical system. For example, one with an internal electric power converter such as an inverter, or an electric power storage system that drives electric appliances by use of an electric motor may be exemplified. The electric power converter such as an inverter and the electric motor are driven as an electrical load through electric supply received from the secondary battery.

According to the present invention, a parameter value is used to make a determination whether one of the secondary batteries is in the singular state or not, and it is possible to specify a secondary battery whose parameter value is away from the parameter values of the other secondary batteries during the time in which the parameter value is in a normal range. Thereby, a secondary battery likely to be abnormal in the future can be predicted in advance.

In another aspect of the present invention, an abnormality prediction system for a plurality of secondary batteries, comprising: a parameter value detection portion that detects parameter values corresponding to each of the plurality of secondary batteries; a parameter value obtaining portion that obtains the parameter values and determines whether the parameter values are in normal range or not; and a singular state determination portion that determines, based on the parameter values which are determined to be in normal, whether one of the secondary batteries is in a singular state or not, the singular state being a state where the parameter value of the secondary battery is away from those of other secondary batteries during the time in which the parameter values are in the normal range.

BRIEF DESCRIPTION OF THE DRAWINGS

FIG. 6 is a second diagram showing transitions of parameter values indicative of states of secondary batteries.

FIG. 7 is a second diagram showing a processing flow of an abnormality prediction system for secondary batteries.

DETAILED DESCRIPTION OF THE INVENTION

Hereunder is a description of an abnormality prediction system for secondary batteries according to one non-limited embodiment of the present invention with reference to the drawings.

Figure 1:
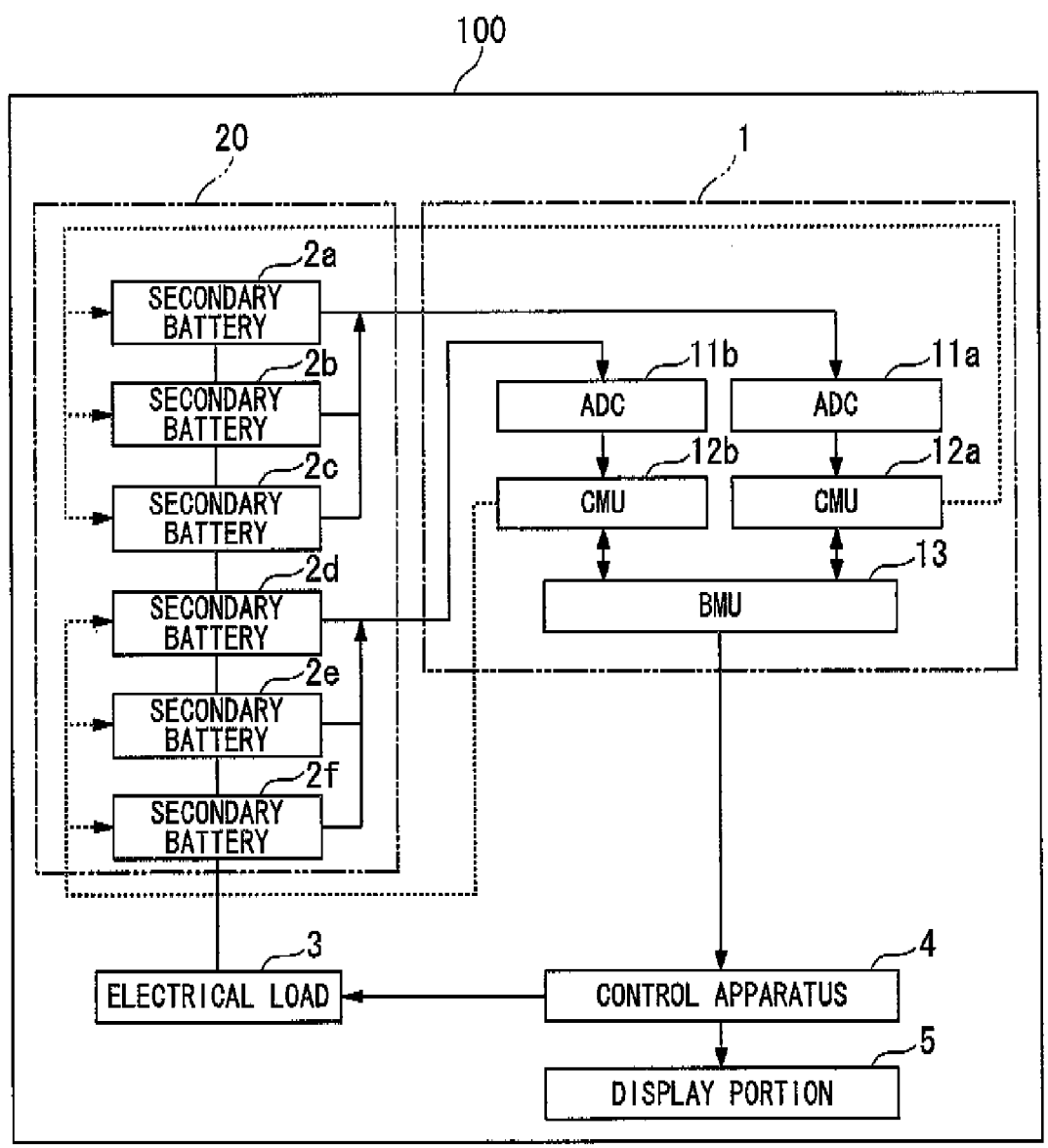
FIG. 1 is a block diagram showing a structure of an abnormality prediction system for secondary batteries.

FIG. 1 is a block diagram showing a structure of the abnormality prediction system for secondary batteries according to the embodiment.

In the figure, a BMS (Battery Management System) 1 monitors and controls a plurality of secondary batteries 2. The BMS 1 comprises a BMU 13, CMUs 12a, 12b, and ADCs 11a, 11b, which will be described later. Reference numerals 2a to 2f denote secondary batteries constituting an assembled battery 20 (hereinafter, each of the secondary batteries is generically referred to as a secondary battery 2). An electrical load 3 receives a supply of electric power from the assembled battery 20. Here, the secondary batteries 2 are electrically connected in series to constitute the assembled battery 20. Furthermore, the BMS 1 and the assembled battery 20 are connected with each other by a signal line, and the BMS 1 and the assembled battery 20 constitute thereby an abnormality prediction system for secondary batteries (hereinafter, generically referred to as an abnormality prediction system 100).

In the present embodiment, the abnormality prediction system 100 is described as an electric vehicle, which is an example of an electric system. The electrical load 3 is, for example, an electric motor or an electric power converter such as an inverter connected to wheels (not shown in the figure). A control apparatus 4 controls an operation of the electric vehicle such as an operation of the inverter, and the number of revolutions of the electric motor. The electrical load 3 may be exemplified as an electrical motor that drives windshield wipers or the like.

Other than an electric vehicle, the abnormality prediction system 100 may be an industrial vehicle such as a fork lift or an electric train, or may be an airplane or a ship in which a propeller or a screw is connected to an electric motor as an electrical load. Furthermore, the abnormality prediction system 100 may be, for example, a stationary system such as a household energy storage system or a power grid stabilization system that is combined with power generation using natural energy such as a windmill or solar rays. That is, the abnormality prediction system 100 is a system that utilizes the charging and discharging of electric power by the secondary batteries.

In the present embodiment, the assembled battery 20 supplies electric power to the electrical load 3 of the electric vehicle. Furthermore, the abnormality prediction system 100 as a battery system outputs information on the secondary battery 2 that has been predicted to have a possible abnormality in the future to the control apparatus 4 of the electric vehicle. The control apparatus 4 of the electric vehicle, in turn, displays the information on the secondary battery 2 that has been predicted to have a possible abnormality in the future on a display portion 5 such as a liquid crystal panel put in front of a driver. Hereunder is a detailed description of constituent elements of the abnormality prediction system 100.

As shown in FIG. 1, the abnormality prediction system 100 comprises: ADCs (Analog Digital Converters) 11a, 11b (hereinafter, each genetically referred to as an ADC 11); CMUs (Cell Monitor Units) 12a, 12b (hereinafter, each genetically referred to as a CMU 12); and a BMU (Battery Management Unit) 13.

The ADC 11 performs processing of receiving, from secondary batteries 2, a signal with a parameter value indicative of a state of the corresponding secondary battery 2 as an analog signal. The ADC 11 also performs processing of converting the analog signal to a digital signal, and of outputting the digital signal to the CMU 12. In the present embodiment, a parameter value indicative of a state of a secondary battery 2 is, for example, a voltage value. Other than the voltage value, a parameter value may be a temperature of a secondary battery 2, a potential difference between a package of a secondary battery 2 formed of a conductive material and a negative electrode of the secondary battery 2 (hereinafter, referred to as a can potential), or the like. A variety of values can be used as the parameter so long as they change according to the state of the secondary battery 2.

The CMU 12 performs processing of outputting the parameter value, which has been received from the ADC 11, to the BMU 13. The CMU 12 also performs processing of monitoring the plurality of secondary batteries 2. In the present embodiment, the CMU 12a is connected to three secondary batteries 2a, 2b, and 2c via the ADC 11a, as shown in FIG. 1. Furthermore, the CMU 12b is connected to three secondary batteries 2d, 2e, and 2f via the ADC 11b.

The BMU 13 performs processing of predicts an abnormality based on the parameter value received from the CMU 12 and specifying a secondary battery 2 to be regarded as a possible warning target. The BMU 13 then performs processing of outputting possible warning target information indicative of the specified secondary battery 2 to the control apparatus 4. The BMU 13 is electrically connected to the CMUs 12a, 12b with signal lines. The BMU 13 performs processing of centrally managing the secondary batteries 2a to 2f that constitute the assembled battery 20, based on pieces of information, such as the temperature, voltage value, and obtained from the CMUs 12.

Figure 2:
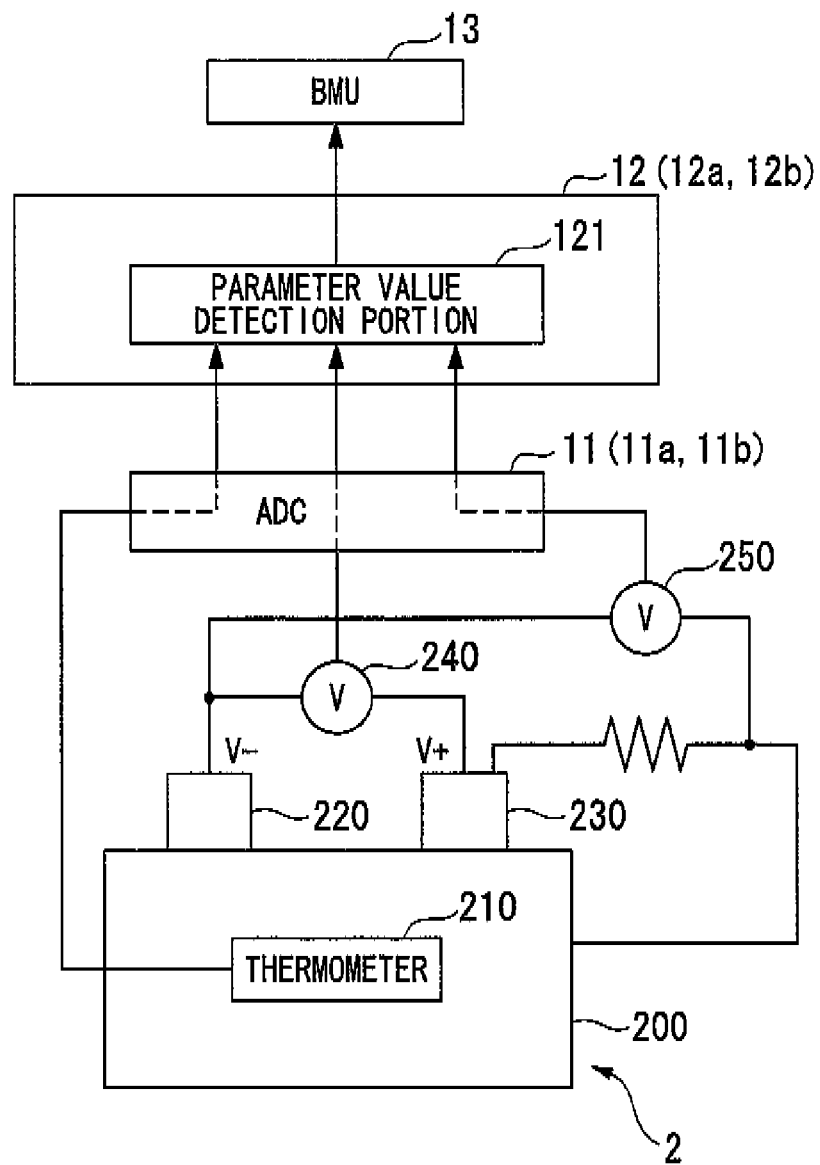
FIG. 2 is a diagram showing an exemplary electrical connection among a secondary battery, an ADC and a CMU.

FIG. 2 is a diagram showing an exemplary electrical connection among a secondary battery, an ADC and a CMU.

The ADC 11 converts an analog signal of a parameter value to a digital signal and outputs the digital signal to the CMU 12. In this embodiment, the parameter value can be exemplified as a temperature, in addition to the voltage value of the secondary battery 2 and the can potential of the secondary battery 2.

The CMU 12 comprises a parameter value detection portion 121 that receives a signal of a parameter value from the ADC 11 and detects the parameter value.

The parameter value detection portion 121 of the CMU 12 is connected via the ADC 11 to a voltmeter 240 provided between a positive terminal 230 and a negative terminal 220 of the secondary battery 2. The parameter value detection portion 121 obtains a voltage value of the secondary battery 2 from the voltmeter 240.

In the case where a parameter value is a temperature of the secondary battery 2, a temperature measuring circuit 210 is attached to a package 200 of the secondary battery 2. The temperature measuring circuit 210 comprises a sensor for measuring the temperature of the secondary battery 2. The parameter value detection portion 121 of the CMU 12 is connected via the ADC 11 to the temperature measuring circuit 210 of the secondary battery 2 with a signal line, and obtains data indicative of the temperature value of the secondary battery 2 measured by the temperature measuring circuit 210.

In the case where a parameter value is a can potential, the parameter value detection portion 121 of the CMU 12 obtains, via the ADC 11, the can potential from a voltmeter 250 that detects a potential between the package 200 of the secondary battery 2 and the positive terminal 230 of the secondary battery 2.

Figure 3:
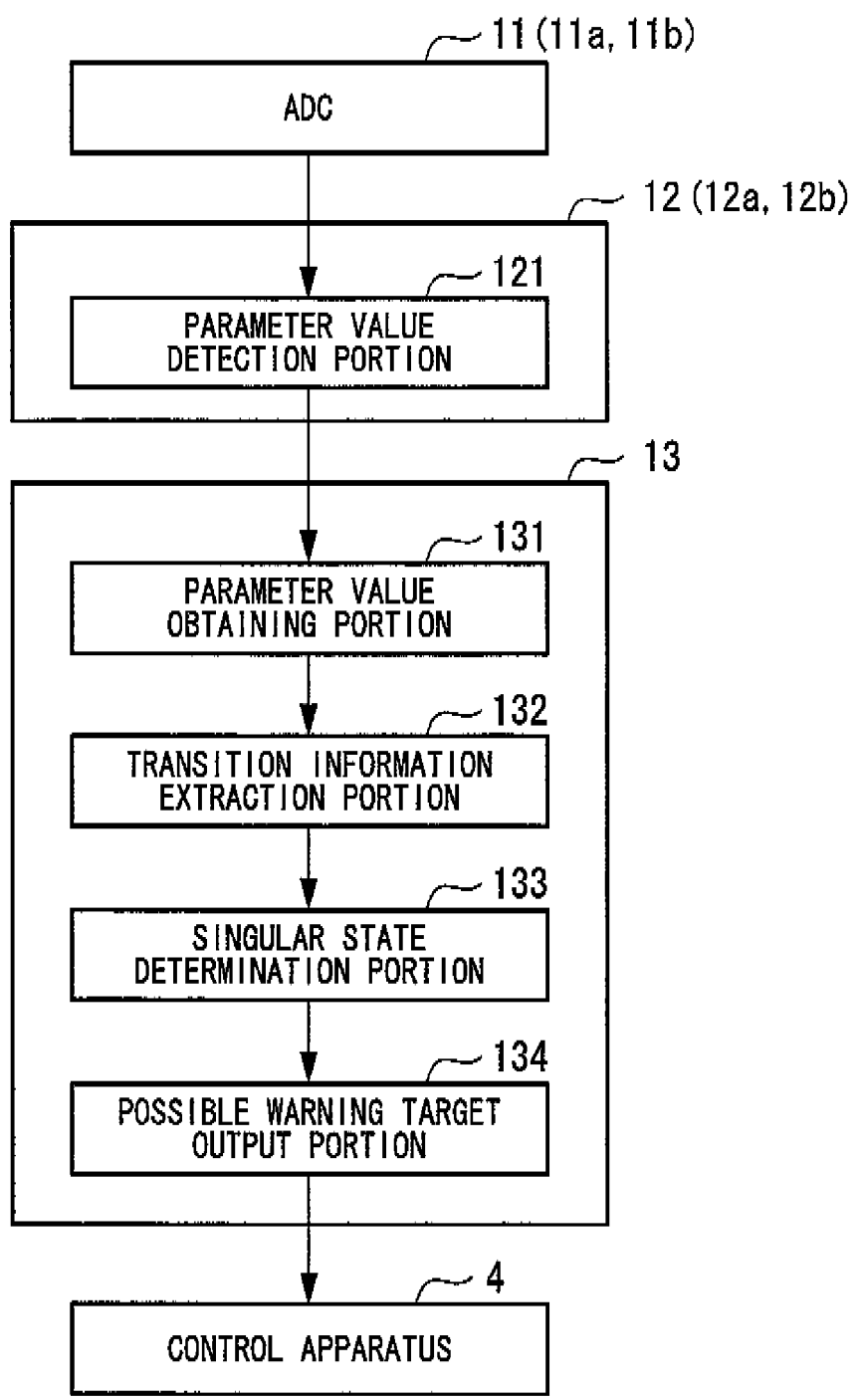
FIG. 3 is a diagram showing function blocks of a CMU and a BMU.

FIG. 3 is a diagram showing function blocks of a CMU and a BMU.

Figure 4:
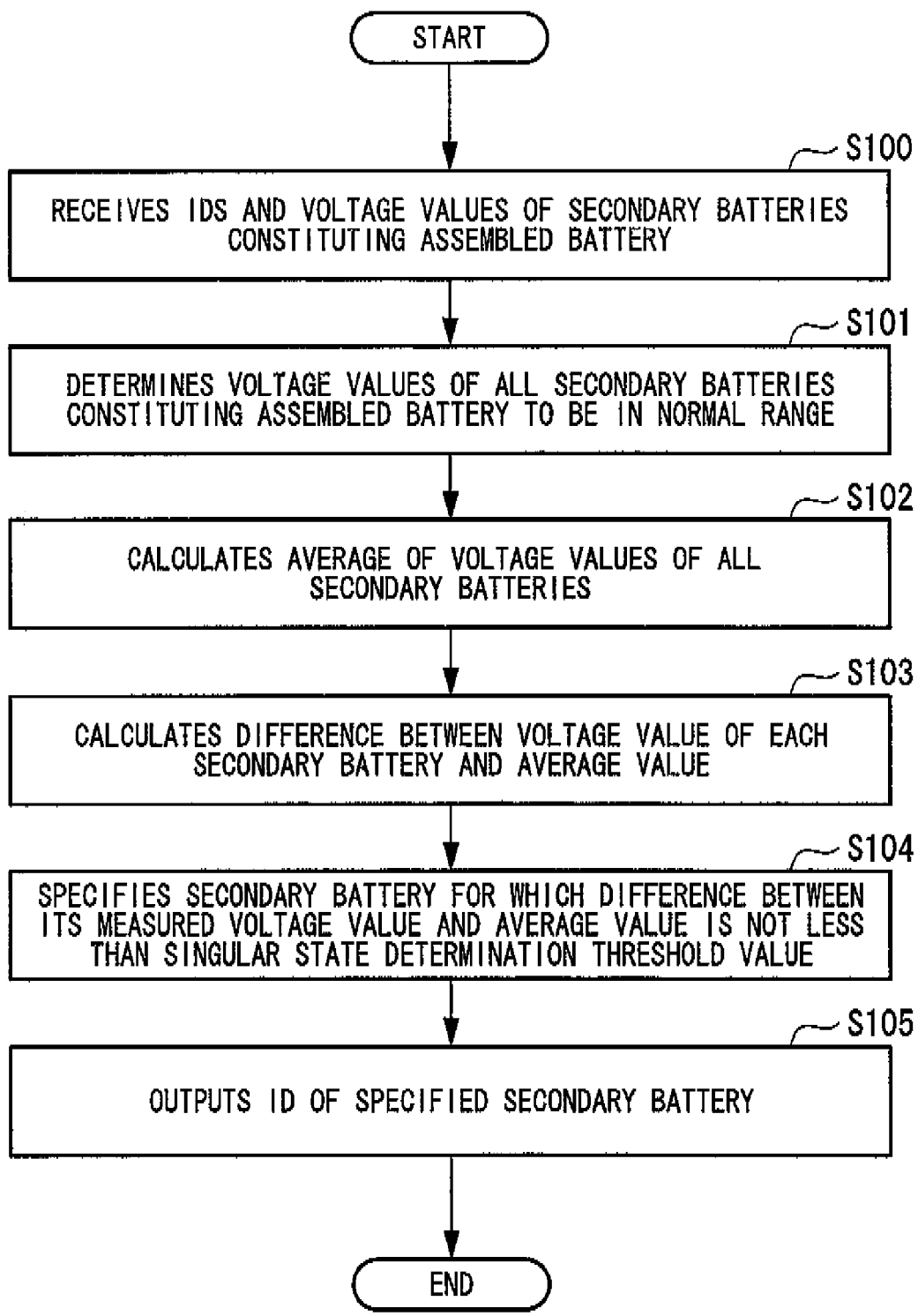
FIG. 4 is a first diagram showing a processing flow of an abnormality prediction system for secondary batteries.

FIG. 4 is a first diagram showing a processing flow of an abnormality prediction system 100.

Next, the processing flow of the abnormality prediction system 100 will be described step by step with reference to FIG. 3 and FIG. 4.

As shown in FIG. 3, the BMU 13 comprises a parameter value obtaining portion 131, a transition information extraction portion 132, a singular state determination portion 133, and a possible warning target output portion 134. These portions are performed by corresponding programs being executed in the CPU of the BMU 13. Here, the "singular state" is a state in which a corresponding secondary battery 2 is different from states of other secondary batteries 2 although the corresponding secondary battery 2 is not in abnormal state. Thus, the "singular state" suggests that there may be a potential "abnormality".

First, the parameter value detection portion 121 of the CMU 12a obtains voltage values of the secondary batteries 2a to 2c from the ADC 11a via signal lines respectively corresponding to the secondary batteries 2a to 2c. Similarly, the parameter value detection portion 121 of the CMU 12b obtains voltage values of the secondary batteries 2d to 2f from the ADC 11b via signal lines respectively corresponding to the secondary batteries 2d to 2f. The CMUs 12a, 12b are connected to the voltmeters 240 of the secondary batteries respectively with different signal lines. Therefore, at this time, since each of the CMUs 12a, 12b is connected to corresponding secondary batteries 2 respectively with the different signal lines, the CMUs 12a and 12b can specify, on the basis of the signal lines, a particular secondary battery 2. Then, the CMUs 12a and 12b output the ID of the particular secondary battery 2 and voltage value of the particular secondary battery 2 to the BMU 13.

Next, on receiving the information of the IDs and the voltage values of the secondary batteries 2 from the CMU 12 (Step S100), the parameter value obtaining portion 131 registers the corresponding relationship between the IDs and the voltage values of the secondary batteries 2 with a voltage value storage table stored in a memory of the BMU 13. Here, if the IDs of the secondary batteries 2a to 2f are defined respectively as ID 2a to ID 2f and the voltage values obtained from the secondary batteries 2a to 2f are defined respectively as Va to Vf, then ID 2a and Va, ID 2b and Vb, ID 2c and Vc, . . . , ID 2f and Vf are respectively brought into correspondence with each other, and are registered with the voltage value storage table. The parameter value obtaining portion 131 then reads an upper limit value and a lower limit value indicative of a normal value range of the voltage values previously recorded in a normal range storage table in the memory. The parameter value obtaining portion 131 then determines whether the voltage values Va to Vf of all the secondary batteries 2a to 2f are not less than the lower limit value and not greater than the upper limit value, or not. If determining that the voltage values Va to Vf of all the secondary batteries 2 are not less than the lower limit value and not greater than the upper limit value indicative the normal range of the voltage values, the parameter value obtaining portion 131 determines that the voltage values Va to Vf of all the secondary batteries 2a to 2f constituting the assembled battery 20 are in the normal range (Step S101).

If the parameter value obtaining portion 131 determines that the voltage values Va to Vf of all the secondary batteries 2a to 2f are in the normal range, then the transition information extraction portion 132 reads the voltage values Va to Vf of all the secondary batteries 2a to 2f from the voltage value storage table, and calculates an average value Vx of the voltage values Va to Vf (Step S102). The transition information extraction portion 132 then outputs the average value Vx of the voltage values to the singular state determination portion 133. The singular state determination portion 133, in turn, reads the ID 2a indicative of the secondary battery 2a and the voltage value Va registered correspondingly to the ID from the voltage value storage table, and calculates a difference between the voltage value Va and the average value Vx (Step S103). Furthermore, the singular state determination portion 133 reads a singular state determination threshold value for the voltage values that is stored in the memory of the BMU 13. The singular state determination portion 133 then determines whether the calculation result in Step S103 is not less than the singular state determination threshold value or not. The singular state determination portion 133 similarly calculates a difference between a voltage value and the average value Vx for each of the voltage values Vb to Vf of the secondary batteries 2b to 2f, and determines whether a difference is not less than the singular state determination threshold value or not. The singular state determination portion 133 then specifies a secondary battery 2 for which an absolute value of a difference between its measured voltage value and the average value Vx is not less than the singular state determination threshold value, or for which the absolute value is greater than the singular state determination threshold value (Step S104). Then, the singular state determination portion 133 outputs the ID of the specified secondary battery 2 to the possible warning target output portion 134. Then, the possible warning target output portion 134 outputs the ID of the specified secondary battery 2 to the control apparatus 4 in the form of a digital signal (Step S105). That is, the possible warning target output portion 134 outputs the ID, which corresponds to the specified secondary battery 2 having been determined to be in a state different from those of other secondary batteries by the singular state determination portion 133, to the control apparatus 4 in the form of a digital signal. If there is a voltage value not in the normal range in Step S101, then a secondary battery 2 for which the voltage value has been measured is determined to be abnormal. Then, the BMU 13 outputs an information of the secondary battery 2 which has a voltage value not in the normal state, to the control apparatus 4 as warning information. The control apparatus 4, in turn, outputs warning information to the display portion 5.

Figure 5:
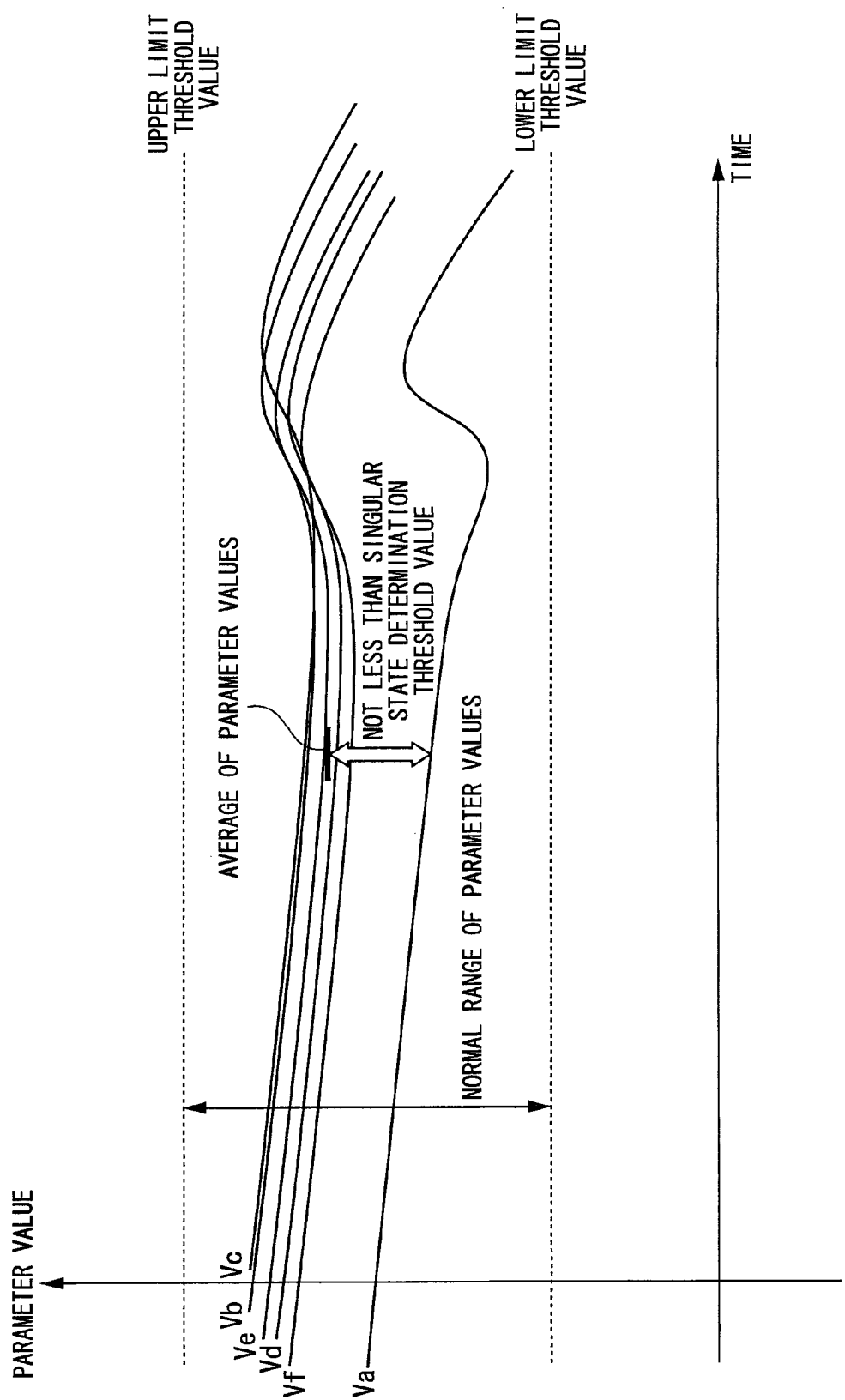
FIG. 5 is a first diagram showing transitions of parameter values indicative of states of secondary batteries.

FIG. 5 is a first diagram showing transitions of parameter values that show the states of the secondary batteries 2.

In the figure, transitions of the voltage values Va to Vf of the secondary batteries 2a to 2f constituting the assembled battery 20 are shown. It is an example in case that the voltage value Va of the secondary battery 2a, as a parameter, is different in state from the voltage values of the other secondary batteries 2. The secondary battery 2a that is different in state from the other secondary batteries 2b to 2f in this manner has a high probability of exceeding the normal range of the parameter values in the future to be detected as abnormal.

In the example shown FIG. 5, a particular secondary battery 2, in the case where a difference between a voltage value of the particular secondary battery 2 and the average value Vx at a given point is not less than the singular state determination threshold value, is determined to be a secondary battery 2 in a state different from those of other secondary batteries 2. However, in the case where a difference between a voltage value of the particular secondary battery 2 and the average value Vx is not less than the singular state determination threshold value for a given period of time, the particular secondary battery 2 may be determined to be a secondary battery 2 in a state different from those of other secondary batteries 2.

In this case, the singular state determination portion 133 repeats the calculation of the difference between a voltage value and the average value Vx in Step S103 for the given period of time or longer. Then, in Step S104, the singular state determination portion 133 specifies a secondary battery 2 whose voltage value has been measured to be not less than the singular state determination threshold value in all the calculations.

In Step S105, the control apparatus 4 having received the ID (as a digital signal) of the secondary battery 2 displays the ID of the secondary battery 2 on the display portion 5 such as a liquid crystal, panel put in front of the driver.

The voltage value of the secondary battery 2 in the singular state is between the upper limit value and the lower limit value of the normal range of the parameter values for the secondary battery 2. Accordingly, the voltage value of the secondary battery 2 in the singular state suggests a possible future abnormality, and, hence, is different from a signal of warning that carries out an instruction such as to immediately cause the control apparatus 4 to stop the system of the electric vehicle. The control apparatus 4 may record the ID of the secondary battery 2 which is in the singular state, which has been received form the BMU 13, in a storage portion or the like as a flag for a next check up.

In the case where the state of the voltage of a secondary battery 2 is different from those of other secondary batteries 2, it can be grasped that in the secondary battery 2, there occurs any of: a decrease in impedance of an external circuit of the secondary battery 2 due to a decrease in insulation of current lines or voltage lines; a decrease in impedance between the battery case and the negative electrode due to a decrease in electrolyte solution; a decrease in insulation of the separator; a decrease in insulation impedance between stacked electrode plates in the package of the secondary battery 2 and its package (the package of the secondary battery 2); a decrease in impedance of the internal circuit of the secondary battery 2 due to a precipitation of reaction matter (such as a precipitation of lithium) or a mixture of foreign matter (such as a mixture of dust); Joule heating by the internal impedance being high; and a decrease in function of the safety valve provided in the package of the secondary battery 2 due to gas production inside the package. These matters allow for a prediction that the secondary battery 2 will have a possible abnormality in the future.

In the case where a temperature state of a secondary battery 2 is different from those of other secondary batteries 2, it can be grasped that the secondary battery 2 generates Joule heating due to high internal impedance. This allows for a prediction that the secondary battery 2 will have a possible abnormality in the future.

In the case where a state of a can potential of a secondary battery 2 is different from states of the voltages of other secondary batteries 2, it can be grasped that in the secondary battery 2, there is a possibility of occurrence of an internal short-circuit, liquid leakage, or the like. This allows for a prediction that the secondary battery 2 will have a possible abnormality in the future.

Here, there are cases where, as a package of the secondary battery 2, an aluminum-based material is used (the package made of a metal is referred to as a battery can), for example, in order to make a lithium secondary battery lighter or in view of the easiness for molding. However, an aluminum-based material, in case of reacting with lithium ions, may lead to an electrochemical reaction via the battery can according to the circumstances of the electric fields associated with the charging and discharging of the stacked electrode plates. In case that lithium ions contact to an inner surface of the battery can, the inner surface is alloyed into LiAl, and it leads to a possible damage in the battery can, resulting from a decrease in strength of the battery can or an advance of corrosion reaction in the battery can. To avoid such reaction in which the inner surface of the battery can becomes an alloy, one method such as coating the inner surface of the battery can be conceived. However, even if the inner surface of the battery can is coated with an insulating material, there is a possibility that a defect (such as uneven coating or a pinhole in coating) is generated in a part of the coating, resulting in attachment of a nonaqueous electrolyte solution including lithium ions to the inner surface of the battery can. In this case, to avoid a reaction in which the inner surface of the battery can becomes the alloy, a technique is used in which the positive terminal of the battery and the battery can are connected via an electric current restriction device (for example, a resistor) to prevent an electrochemical reaction caused by the lithium ions on the surface of the battery can (for example, one that is described in Japanese Laid-Open Patent Publication No. 2008-186591).

According to this technique, the positive terminal and the battery can are connected via the electric current restriction device. Therefore, the potential of the battery can is the same as that of the positive terminal in a usual state (a normal state), and making it possible to prevent a lithium precipitation on the inner surface of the battery can that can be exposed to the electrolyte solution. A reaction in which an aluminum-based battery can is alloyed into LiAl by the lithium ions included in the electrolyte solution and the battery can electrochemically advances under such a circumstance that the battery can and the negative electrode are at the same potential level. Therefore, with the potential of the battery can being retained in a potential region that is capable of preventing its reaction of being alloyed with lithium ions into LiAl, it is possible to prevent the inner surface of the battery can from being made into an alloy. Here, to determine whether the potential of the battery can is maintained in such a potential region or not, it can be conceived that the potential of the battery can is measured by a voltage measurement device. In the case where the potential of the battery can is not maintained in a predetermined potential region although the positive terminal and the battery can are connected via an electric current restriction device, there is a possibility of an occurrence of, for example, a decrease in impedance between the inner surface of the battery can and an electrode, a decrease in electrolyte liquid, or the like. Therefore, it is meaningful to measure the potential of the battery can to monitor the state of the secondary battery 2.

FIG. 6 is a second diagram showing transitions of parameter values indicative of the states of the secondary batteries (the parameter values are substantially in normal distribution).

FIG. 7 is a second diagram showing a processing flow of the abnormality prediction system for secondary batteries.

FIG. 6 shows transitions of voltage values Va to Vf of secondary batteries 2a to 2f that constitute the assembled battery 20. It shows an example in the case where a deviation of the voltage value Va of the secondary battery 2a, from an average value Vx of the voltage values of the secondary batteries 2a to 2f is away from a standard deviation by not less than a threshold value.

In the aforementioned example shown in FIG. 5, if a difference between a voltage value and the average value Vx is not less than the singular state determination threshold value, the secondary battery 2 with the voltage value is determined to be different in state from other secondary batteries 2. However, as shown in FIG. 6, if a deviation of a voltage value of a secondary battery 2 from the average value of the voltage values of all the secondary batteries 2 is away from a standard deviation of the voltage values of all the secondary batteries 2 by not less than the threshold value, the secondary battery 2 with the voltage value may be determined to be different in state from other secondary batteries 2.

In the processing in this case, similarly to the processing in FIG. 4, the parameter value obtaining portion 131 of the BMU 13 receives the information of the IDs and the voltage values of all the secondary batteries 2 from the CMU 12 (Step S200), and determines that the voltage values Va to Vf of the secondary batteries 2a to 2f are in the normal range (Step S201). Next, the transition information extraction portion 132 reads the voltage values Va to Vf of all the secondary batteries 2a to 2f from the voltage value storage table, and calculates an average value Vx of the voltage values Va to Vf (Step S202). Furthermore, the transition information extraction portion 132 calculates a standard deviation $\pm\sigma$ for the voltage values Va to Vf (Step S203). Then, the singular state determination portion 133 reads the singular state determination threshold value, stored in the memory, for voltage values. The singular state determination portion 133 then reads the voltage value Va of the secondary battery 2a from the voltage value storage table, and determines whether or not a deviation of the voltage value Va from the average value Vx is away from the standard deviation $\pm\sigma$ by not less than the singular state determination threshold value (Step S204). In addition, also for the voltage values Vb to Vf of all the secondary batteries 2b to 2f that constitute the assembled battery 20, the singular state determination portion 133 determines whether or not a deviations of a voltage value from the average value Vx is away from the standard deviation $\pm\sigma$ by not less than the singular state determination threshold value. The singular state determination portion 133 then specifies the secondary battery 2 for which a deviation of its voltage value from the average value Vx is not less than the singular state determination threshold value (Step S205), and outputs the ID of the secondary battery 2 to the possible warning target output portion 134. Then, the possible warning target output portion 134 outputs the ID of the secondary battery 2 to the control apparatus 4 in the form of a digital signal (Step S206).

In the flow shown in FIG. 7, if a deviation of a voltage value of a secondary battery 2 from the average value Vx at a given point of time is away from the standard deviation $\pm\sigma$ by not less than the singular state determination threshold value, the secondary battery 2 for which the voltage value has been measured is determined to be a secondary battery 2 in a state different from those of other secondary batteries 2. However, if a secondary battery 2 is away from the standard deviation $\pm\sigma$ by not less than the singular state determination threshold value for a given period of time or longer, the secondary battery 2 for which the voltage value has been measured may be determined to be a secondary battery 2 in a singular state.

In this case, the singular state determination portion 133 repeats, over a given period of time or longer, the determination whether or not a deviation of a voltage value from the average value Vx is away from the standard deviation $\pm\sigma$ by not less than the singular state determination threshold value in Step S203. Then, the secondary battery 2, whose voltage value has been measured in all the determinations to have a deviation from the average value Vx being away from the standard deviation $\pm\sigma$ by not less than the singular state determination threshold value, is specified in Step S204.

Instead of the standard deviation $\pm\sigma$, its nth multiplication, that is, $\pm n\sigma$ may be used in Step S204.

Furthermore, if the standard deviation $\pm\sigma$ itself is not between the predetermined values, the secondary battery that has caused the situation may be determined to be a secondary battery in a singular state.

In the aforementioned processing flow of the abnormality prediction system 100, only a single parameter value is used to grasp the states of the plurality of secondary batteries 2 and specify a secondary battery 2 in a singular state. However, several kinds of the parameter values may be used to grasp the states of the plurality of secondary batteries 2 and specify a secondary battery 2 in a singular state. For example, three kinds of the parameter values (for example, a voltage value, a can potential, and a temperature value for each secondary battery 2) may be used to grasp the states of the secondary batteries 2. Then, if a plurality of secondary batteries 2 are in a singular state in terms of two or more parameter values at the same time, the secondary batteries 2 may be determined to be in a singular state.

Through the above processing, according to the abnormality prediction system 100, a secondary battery 2 in a state different from those of other secondary batteries 2 is specified during the time in which the parameter value(s), indicative of the states of the secondary batteries 2, are in the normal range. Thereby, a secondary battery 2 likely to be abnormal in the future can be specified in advance. With the advance specification of a secondary battery 2 likely to be abnormal in the future, it is possible to enhance the safety of an electric vehicle or the like as a battery system if for example, a replacement, maintenance, or the like is performed on the secondary battery 2 before the secondary battery 2 becomes actually in an abnormal state.

The CMU 12 and the BMU 13 in the abnormality prediction system 100 internally have a computer system. The process of the aforementioned processing is stored in a computer-readable recording medium in the form of a program. The above processing is performed by the computer reading and executing the program.

Furthermore, FIG. 1 shows an example where a plurality of CMUs 12 are present in the BMS 1. However, it may be configured such that only a single CMU 12 is incorporated in the BMS 1, and that the single CMU 12 manages all the secondary batteries 2a to 2f that constitute the assembled battery 20. Furthermore, it may be configured such that the CMU 12 comprises a part of the processing function of the BMU 13, or that the BMU 13 comprises a part of the processing function of the CMU 12.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. An abnormality prediction system for a plurality of secondary batteries, comprising:
a parameter value detection portion that detects parameter values respectively corresponding to each of the plurality of secondary batteries, and that determines whether all the parameter values are normal or not; and
a transition information extraction portion that is configured to calculate an average value of all the parameter values determined to be normal by the parameter value detection portion; and
a singular state determination portion that determines, if a difference between the average value and at least one of the parameter values is not less than a threshold value, the secondary battery corresponding to the parameter value with the difference not less than the threshold value to be in a state different from those of other secondary batteries out of the plurality of secondary batteries.

2. The abnormality prediction system for secondary batteries according to claim 1, wherein
in each of the plurality of secondary batteries, a positive electrode and a battery can are electrically connected to each other, and
the parameter value is a can potential.

3. The abnormality prediction system for secondary batteries according to claim 1, further comprising:
a display portion that displays, on receiving a determination by the singular state determination portion, a result of the determination; and
an electrical load that is driven by the secondary batteries.

4. An abnormality prediction system for a plurality of secondary batteries, comprising;
a parameter value detection portion that detects parameter values respectively corresponding to each of the plurality of secondary batteries, and determines whether all the parameter values are normal or not,
a transition information extraction portion that calculates an average value of all the parameter values determined to be normal by the parameter value detection portion, and that calculates a deviation from the average value; and
a singular state determination portion that determines, if the deviation is away from a standard deviation by not less than a threshold value, the secondary battery corresponding to the parameter value with the deviation not less than the threshold value to be in a singular state which is a state in which a corresponding secondary battery is different from states of other secondary batteries although the corresponding secondary battery is not in an abnormal state.

5. The abnormality prediction system for secondary batteries according to claim 4, wherein
in each of the plurality of secondary batteries, a positive electrode and a battery can are electrically connected to each other, and
the parameter value is a can potential.

6. An abnormality prediction system for a plurality of secondary batteries, comprising:
a parameter value detection portion that detects parameter values corresponding to each of the plurality of secondary batteries;
a parameter value obtaining portion that obtains the parameter values and determines whether the parameter values are in normal range or not;
a singular state determination portion that determines, based on the parameter values which are determined to be in normal, whether one of the secondary batteries is in a singular state or not, the singular state being a state where the parameter value of the secondary battery is away from those of other secondary batteries during the time in which the parameter values are in the normal range;
a voltmeter that detects a voltage value of each of the secondary batteries, as the parameter value, wherein the parameter value detection portion specifies a secondary battery out of the secondary batteries by use of the voltage value, and wherein the parameter value detection portion outputs the voltage value with an identification (ID) of the specified secondary battery; and
a control apparatus that receives the ID of the secondary battery, and records the ID as a flag in a memory.

7. The abnormality prediction system for a plurality of secondary batteries according to the claim 6,
wherein the singular state determination portion determines whether one of the secondary batteries is in the singular state or not, in case that the parameter value of the secondary battery is away from those of other secondary batteries at a time.

8. The abnormality prediction system for a plurality of secondary batteries according to the claim 6,
wherein the singular state determination portion determines whether one of the secondary batteries is in the singular state or not, in case that the parameter value of the secondary battery is away from those of other secondary batteries over a period of time.

9. The abnormality prediction system for a plurality of secondary batteries according to the claim 6,
wherein the parameter value detection portion detects several kinds of the parameter values, and wherein the parameter value obtaining portion obtains the several kinds of the parameter values and determines whether the several kinds of the parameter values are in the normal range or not, and wherein the singular state determination portion determines, based on the several kinds of the parameter values, whether one of the secondary batteries is in the singular state or not.

10. The abnormality prediction system for a plurality of secondary batteries according to the claim 9,
wherein the singular state determination portion determines that one of the secondary batteries is in the singular state, in case that two or more parameter values of the secondary battery are away from those of other secondary batteries.

11. The abnormality prediction system for secondary batteries according to claim 6, further comprising:
a possible warning target output portion that outputs the ID of the secondary battery which is in the singular state; and a display portion that displays an information as to the secondary battery which is in the singular state, based the ID of the secondary battery.

12. The abnormality prediction system for secondary batteries according to claim 6,
wherein the singular state is determined in case that a difference between a reference value and the parameter value of the secondary battery is not less than threshold value, and wherein the reference value is calculated by use of the parameter values which are determined to be in normal.

* * * * *